(12) United States Patent
Ghamaty et al.

(10) Patent No.: US 6,828,579 B2
(45) Date of Patent: Dec. 7, 2004

(54) THERMOELECTRIC DEVICE WITH SI/SIC SUPERLATTICE N-LEGS

(75) Inventors: Saied Ghamaty, La Jolla, CA (US); Norbert B. Elsner, La Jolla, CA (US)

(73) Assignee: Hi-Z Technology, Inc., San Diego, CA (US)

( * ) Notice: Subject to any disclaimer, the term of this patent is extended or adjusted under 35 U.S.C. 154(b) by 0 days.

(21) Appl. No.: 10/021,097

(22) Filed: Dec. 12, 2001

(65) Prior Publication Data

US 2003/0111660 A1 Jun. 19, 2003

(51) Int. Cl.$^7$ ............... H01L 29/06; H01L 31/0328; H01L 31/0336; H01L 31/072; H01L 31/109

(52) U.S. Cl. ............... 257/15; 257/12; 257/13; 257/14; 257/16; 257/467; 257/633; 257/712; 257/930

(58) Field of Search ............... 257/12–16, 712, 257/633, 930, 467

(56) References Cited

U.S. PATENT DOCUMENTS

| | | | | |
|---|---|---|---|---|
| 3,635,757 A | * | 1/1972 | Harris ............... | 117/97 |
| 4,493,939 A | * | 1/1985 | Blaske et al. ............... | 136/212 |
| 4,684,565 A | * | 8/1987 | Abeles et al. ............... | 428/220 |
| 5,225,032 A | * | 7/1993 | Golecki ............... | 117/90 |
| 5,436,467 A | * | 7/1995 | Elsner et al. ............... | 257/15 |
| 5,584,183 A | * | 12/1996 | Wright et al. ............... | 62/3.7 |
| 5,703,896 A | * | 12/1997 | Pankove et al. ............... | 372/50 |
| 5,837,929 A | * | 11/1998 | Adelman ............... | 136/225 |
| 6,096,965 A | * | 8/2000 | Ghamaty et al. ............... | 136/201 |
| 6,207,887 B1 | * | 3/2001 | Bass et al. ............... | 136/201 |
| 6,252,154 B1 | * | 6/2001 | Kamada et al. ............... | 136/201 |
| 6,274,803 B1 | * | 8/2001 | Yoshioka et al. ............... | 136/201 |
| 6,300,150 B1 | * | 10/2001 | Venkatasubramanian ............... | 438/27 |
| 6,388,185 B1 | * | 5/2002 | Fleurial et al. ............... | 136/203 |
| 6,391,676 B1 | * | 5/2002 | Tsuzaki et al. ............... | 438/54 |
| 6,410,971 B1 | * | 6/2002 | Otey ............... | 257/467 |
| 2001/0017151 A1 | * | 8/2001 | Tauchi et al. ............... | 136/200 |
| 2003/0042497 A1 | * | 3/2003 | Span ............... | 257/121 |

FOREIGN PATENT DOCUMENTS

EP   EP 0 553 982   * 4/1993 ............... 257/461

* cited by examiner

Primary Examiner—Amir Zarabian
Assistant Examiner—Ida M. Soward
(74) Attorney, Agent, or Firm—John R. Ross; John R. Ross, III

(57) ABSTRACT

A superlattice thermoelectric device. The device includes p-legs and n-legs, each leg includes a large number of at least two different very thin alternating layers of elements. The n-legs in the device includes alternating layers of silicon and silicon carbide. In preferred embodiments p-legs include a superlatice of B-C layers, with alternating layers of different stoichiometric forms of B-C. This preferred embodiment is designed to produce 20 Watts with a temperature difference of 300 degrees C. with a module efficiency of about 30 percent. The module is about 1 cm thick with a cross section area of about 7 cm$^2$ and has about 10,000 sets of n and p legs each set of legs being about 55 microns thick and having about 5,000 very thin layers (each layer about 10 nm thick).

12 Claims, 6 Drawing Sheets

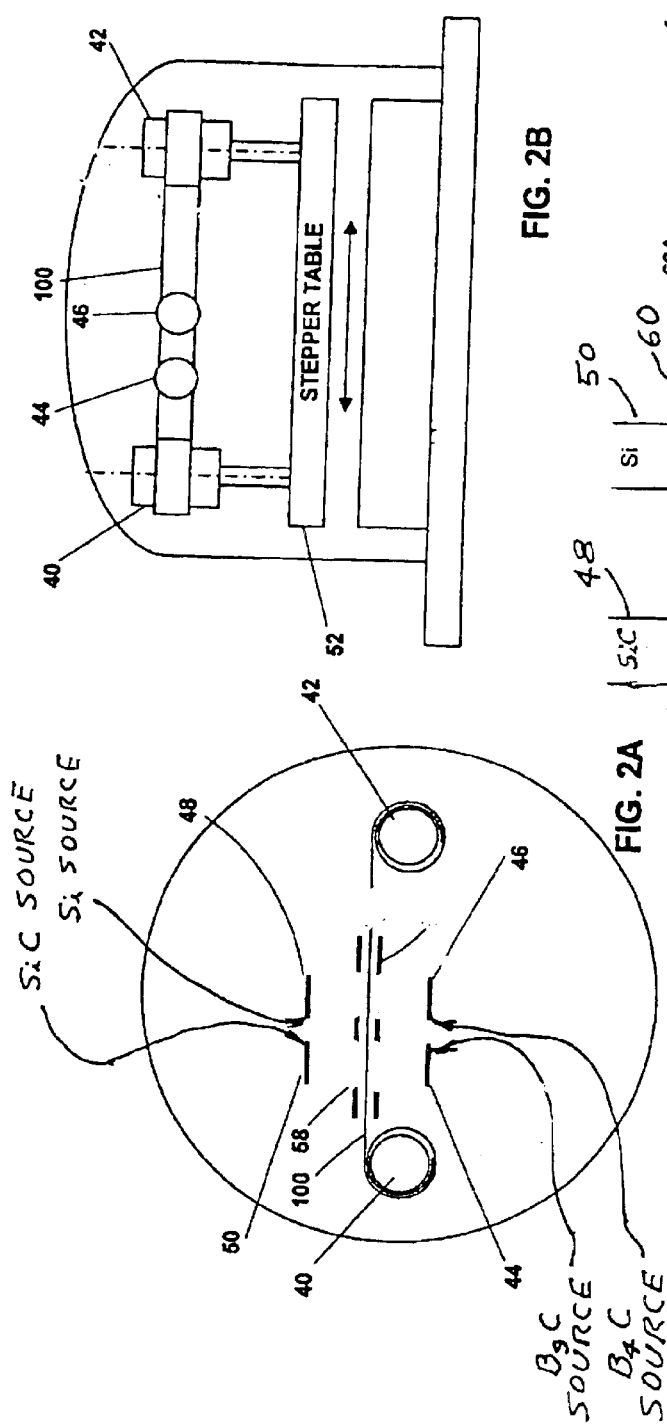

THERMOELECTRIC DEVICE WITH SI/SIC SUPERLATTICE N-LEGS

The present invention relates to thermoelectric devices and in particular to very thin lattice thermoelectric devices.

BACKGROUND OF THE INVENTION

Workers in the thermoelectric industry have been attempting too improve performance of thermoelectric devices for the past 20–30 years with not much success. Most of the effort has been directed to reducing the lattice thermal conductivity (K) without adversely affecting the electrical conductivity. Experiments with superlattice quantum well materials have been underway for several years. These materials were discussed in an paper by Gottfried H. Dohler which was published in the November 1983 issue of Scientific American. This article presents an excellent discussion of the theory of enhanced electric conduction in superlattices. These superlattices contain alternating conducting and barrier layers and create quantum wells that improve electrical conductivity. These superlattice quantum well materials are crystals grown by depositing semiconductors in layers whose thicknesses is in the range of a few to up to about 100 angstroms. Thus, each layer is only a few atoms thick. (These quantum well materials are also discussed in articles by Hicks, et al and Harman published in Proceedings of 1992 1st National Thermoelectric Cooler Conference Center for Night Vision & Electro Optics, U.S.Army, Fort Belvoir, Va. The articles project theoretically very high ZT values as the layers are made progressively thinner.) The idea being that these materials might provide very great increases in electric conductivity without adversely affecting Seebeck coefficient or the thermal conductivity. Harmon of Lincoln Labs, operated by MIT has claimed to have produced a superlattice of layers of (Bi,Sb) and Pb(Te,Se). He claims that his preliminary measurements suggest ZTs of 3 to 4. FIG. 1 shows theoretical calculated values (Sun et al-1998) of ZT plotted as a function of quantum well width.

The present inventors have actually demonstrated that high ZT values can definitely be achieved with $Si/Si_{0.8}Ge_{0.2}$ superlattice quantum well (See, for example, US Pat. No. 5,550,387.) Most of the efforts to date with superlattices have involved alloys that are known to be good thermoelectric materials for cooling, many of which are difficult to manufacture as superlattices. The present inventors have had issued to them United States patents in 1995 and 1996 which disclose such materials and explain how to make them. These patents (which are hereby incorporated by reference herein) are U.S. Pat. Nos.: 5,436,467, 5,550,387. FIGS. 1A and 1B herein were FIGS. 3 and 5 of the '467 patent. A large number of very thin layers (in the '467 patent, about 250,000 layers) together produce a thermoelectric leg 10 about 0.254 cm thick. In the embodiment shown in the figures all the legs are connected electrically in series using sprayed-on metal layers 14 and otherwise are insulated from each other in an egg-crate type thermoelectric element as shown in FIG. 1A. As shown by arrows 30 in FIG. 1B current flows from the cold side to the hot side through P legs 12 and from the hot side to the cold side through N legs 10. (Electrons flow in the opposite direction.) These patents disclose superlattice layers comprised of: (1) SiGe as conducting layer and Si as a barrier layer and (2) alternating layers of two different alloys of boron carbide. In the '387 patent Applicants disclose that they had discovered that strain in the layers can have very beneficial effects on thermoelectric properties of the elements disclosed in the '467 patent.

What are needed are better quantum well materials, even better than the ones discussed above, for thermoelectric devices.

SUMMARY OF THE INVENTION

The present invention provides a superlattice thermoelectric device. The device is comprised of p-legs and n-legs, each leg being comprised of a large number of at least two different very thin alternating layers of elements. The n-legs in the device are comprised of alternating layers of silicon and silicon carbide. In preferred embodiments p-legs are comprised of a superlattice of B-C layers, with alternating layers of different stoichiometric forms of B-C. This preferred embodiment is designed to produce 20 Watts with a temperature difference of 300 degrees C. with a module efficiency of about 30 percent. The module is about 1 cm thick with a cross section area of about $7 \text{ cm}^2$ and has about 10,000 sets of n and p legs each set of legs being about 55 microns thick and having about 5,000 very thin layers (each layer about 10 nm thick).

BRIEF DESCRIPTION OF THE DRAWINGS

FIG. 2A is a top view of a preferred deposition chamber for fabricating thermoelectric film.

FIG. 2B is a side view of a preferred deposition chamber for fabricating thermoelectric film.

FIG. 3 shows an enlarged view of a section of Kapton® tape with alternating layers attached.

DETAILED DESCRIPTION OF PREFERRED EMBODIMENTS

Applicants Earlier Patents

Figure 1A:
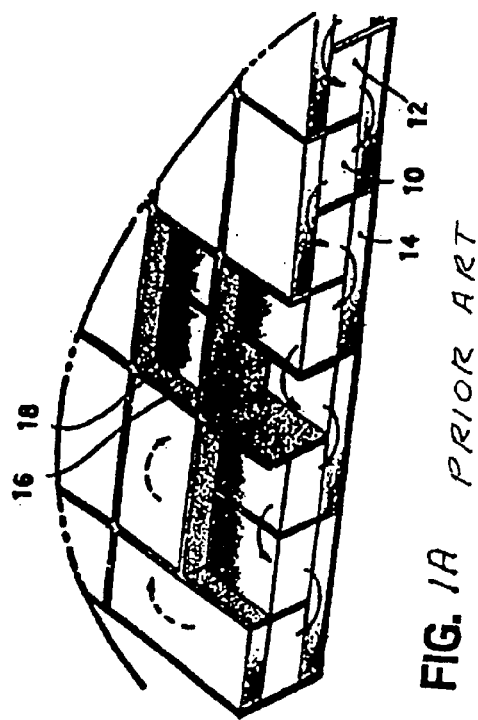
FIGS. 1A and 1B show features of prior art thermoelectric modules.
Figure 1B:
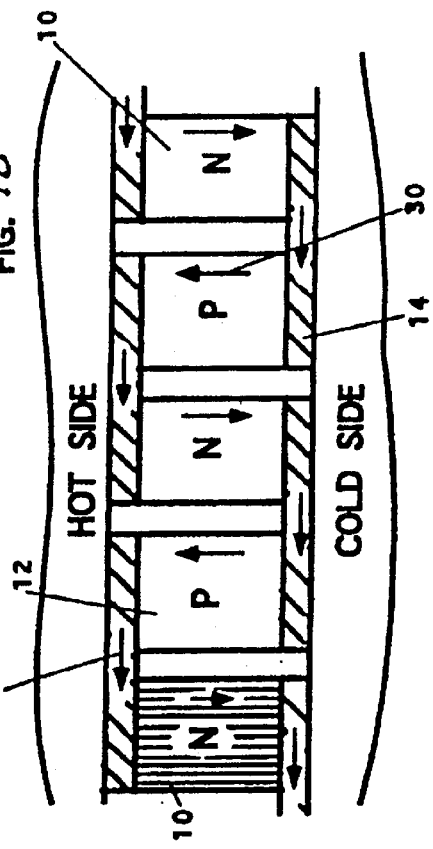
Figure 1:
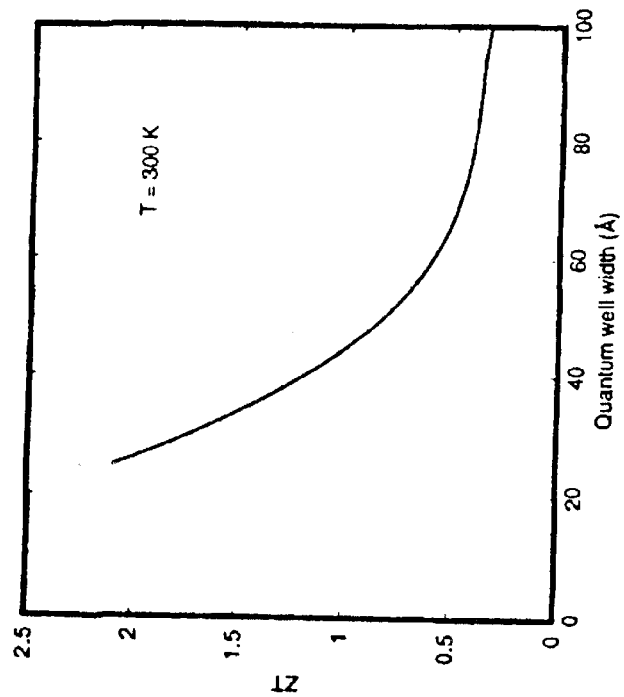
FIG. 1 is a graph showing theoretical values of ZT as a function of quantum well width.

On Aug. 1, 2000 Applicants were granted U.S. Pat. Nos. 6,096,964 and 6,096,965 both of which have been incorporated herein by reference. In these patents Applicants dis- 4close techniques for placing the thin alternating layers on film substrates. In these patents the alternating layers specifically described include layers comprised of silicon and silicon-germanium. The silicon is referred to as barrier layers and the SiGe layers are referred to as conducting layers and are appropriately doped to produce n legs and p legs.

An n-doping atom is typically the atom having one more electron than the base semiconductor atoms. The extra atom provides a conducting electron supporting current flow. A p-doping atom is typically the atom having one fewer electron than the base semiconductor atoms. The missing electron becomes an electron acceptor location (i.e., a hole) supporting current flow. As explained in the Dohler article, in these very thin layers electrons made available for conduction in the n-doped conduction layer can migrate to the boundary layer to make conduction possible there. Applicants believed that the excellent conducting properties of these materials are due to the fact that conduction can take place through the boundary layer crystals without being impeded by ions in the crystals which produce electrostatic fields which impede the flow of electrons. The same reasoning applies to the p-doped layers. In this case excess electrons migrate from the boundary layers to the p-doped conduction layers to produce holes in the boundary layers without current impeding ions. Thus, resistance to current flow is enormously reduced. Some materials possess thermoelectric properties without doping. In the '387 patent Applicants disclose that the layers of boron-carbide would make very good thermoelectric material especially for the p-type legs. GeTe and PbTe were also proposed as possible materials for the T/E elements.

Although the SiGe/Si superlatice material performs very well at low and moderate temperatures, performance above about 250 C is not much better than bulk SiGe alloys. Applicants' boron carbide quantum wells perform very well at low temperature and high temperatures as p-legs and but do not perform well as n-legs. It is for this reason that Applicants investigated and subsequently discovered the very good thermoelectric properties of Si/SiC material. A preferred embodiment of the present invention provides p-legs and n-legs that perform very well at high temperatures with an expectation that thermoelectric modules using these two legs will have module efficiencies of about 30% to 40%.

Applicants' Experiments

Applicants experiments have shown extraordinary promise for thermoelectric couples based on multilayer B4C/B9C films. The power delivered into a matched load, at the level of a fraction of a microWatt, appears small, but is produced from a very small amount of active material. The efficiency calculated for each couple depends on the value taken for the thermal conductivity. If we assume no enhancement of the thermal conductivity, i.e. take the value for bulk $B_4C/B_9C$, the efficiency is about 4% for the lower temperature (90 degree C.) heat source and 10–11% for the 250° C. heat source. These figures are already a significant improvement over bismuth telluride and improve with the low thermal conductivity measurements of UCLA as discussed below.

The power factor numbers ($\alpha^2/\rho$) indicate that there is some quantum well confinement in the $B_4C/B_9C$. The Applicants' data have been confirmed by similar measurements at the Naval Research Laboratory.

The Seebeck coefficient does not change with the relative thickness of the Si substrate since this parameter is independent of thickness. However, as the Si substrate thickness is reduced, the ratio of the film resistance to the substrate resistance is increasing. Since the resistance of the film is so much lower than the Si substrate, the composite resistivity will drop as the substrate thickness decreases.

Si/SiC

Recent test results by Applicants indicate that Si/SiC multi-layer films exhibit very favorable Seebeck coefficient ($\alpha$), resistivity ($\rho$) (see Table I) and power factor ($\alpha^2/\rho$) values as shown in Table I. If their thermal conductivity values are low over the full operating temperature range, as expected for quantum well materials, the thermoelectric figure-of-merit should be close to that of $B_4C/B_9C$. Further, the power factor values are expected to increase with increasing temperature due to a decrease in resistivity and an increase in Seebeck coefficient. Si/SiC multilayer films are therefore highly promising for n-leg application, offering prospects of both a high thermoelectric figure-of-merit and a high operating temperature, based on the refractory nature of silicon carbide. The Applicants are convinced that $B_4C/B_9C$—Si/SiC QW couples will exhibit module efficiencies much improved over prior art couples. They project module efficiencies of 30% to 40%, is a giant step in thermoelectric development.

Figure 5:
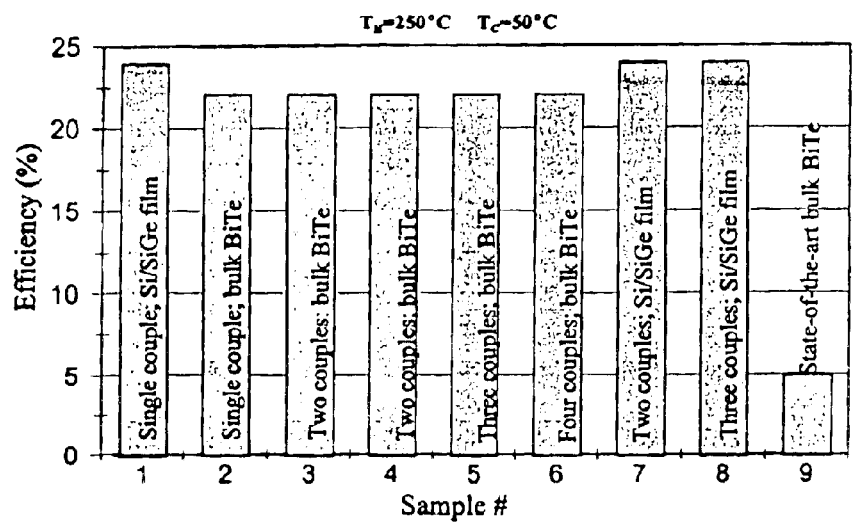
FIG. 5 shows Applicant's calculated efficiencies for several thermoelectric samples.

Recent measurements at UCLA indicate that the thermal conductivity of the B4C/B9C multi-layer films is significantly reduced in comparison with the bulk value. The use of the UCLA low value for the in-plane thermal conductivity leads to a factor of 3 enhancement in the performance (i.e., figure of merit) of the material. The data based on the assumption of the UCLA thermal conductivity value are also included in Table 1 and FIG. 5 and show the promise of this technology. Measurements at UCLA on multi-layer QW films of Si/SiGe also showed a reduction in thermal conductivity by about a factor 3 in comparison with bulk material. The measurement to date has been made only at room temperature.

Applicants' Demonstration Projects

Applicants have successfully produced Si/SiC multi-layer quantum well films. Magnetron sputtering was used to deposit films of SiC with Si as the barrier material, on silicon substrates. Films of individual layer thickness about 100 A, and up to 10,000 A in total thickness, were deposited. Applicants believe that this is the first time that multi-layer films of Si/SiC have been successfully deposited. Measurements on these materials indicated excellent resistivity and Seebeck coefficient values. Table 1 shows the thermoelectric properties of these films at room and higher temperatures. These numbers confirm the promise of this material combination, resulting from QW confinement of the carriers. Based on thermal conductivity measurements of Si/SiGe and $B_4C/B_9C$ films, which have a factor of 3–4 reduction versus bulk alloys, these multi-layer QW Si/SiC films are expected on theoretical grounds to show similar reductions in thermal conductivity. These experiments show that Si/SiC is a preferred choice for the n-leg of a highly efficient thermoelectric power conversion device.

TABLE I

| Temperature (° C.) | Resistivity (mΩ-cm) | Seebeck Coefficient ($\mu$V/° C.) |
|---|---|---|
| 25 | 2.15 | −750 |
| 250 | 1.71 | −1080 |
| 500 | 1.52 | −1240 |

Film deposition was performed using a Veeco magnetron sputtering unit at Hi-Z, with 3-inch targets, and by side-sputtering using 2 or 3 inch targets at the University of California, San Diego (UCSD). Techniques were developed to control and measure the thickness of each layer, with a typical target of 100 A per layer, deposited in about 1 minute. Deposition normally occurred on a [100] silicon wafer 3 inches in diameter. Some non-uniformity was noted around the edges of the wafer, so samples for measurement were taken from the central area. In the case of the B4C/B9C multi-layer films, annealing was performed prior to measurement.

First Preferred Embodiment $B_4C/B_9C$ and Si/SiC Superlattice Module

In this first preferred embodiment thermoelectric elements are made with p-type legs comprised of superlattices of alternating layers of $B_4C$ and $B_9C$ and n-type legs comprised of a superlattices of alternating layers of Si and SiC. Both $B_4C$ (as a p-leg) and SiC (as an n-leg) function as thermoelectric elements without added doping.

Making Thermoelectric Elements $B_4C/B_9C$ p-Legs and SiC/Si n-Legs

Figure 4B:
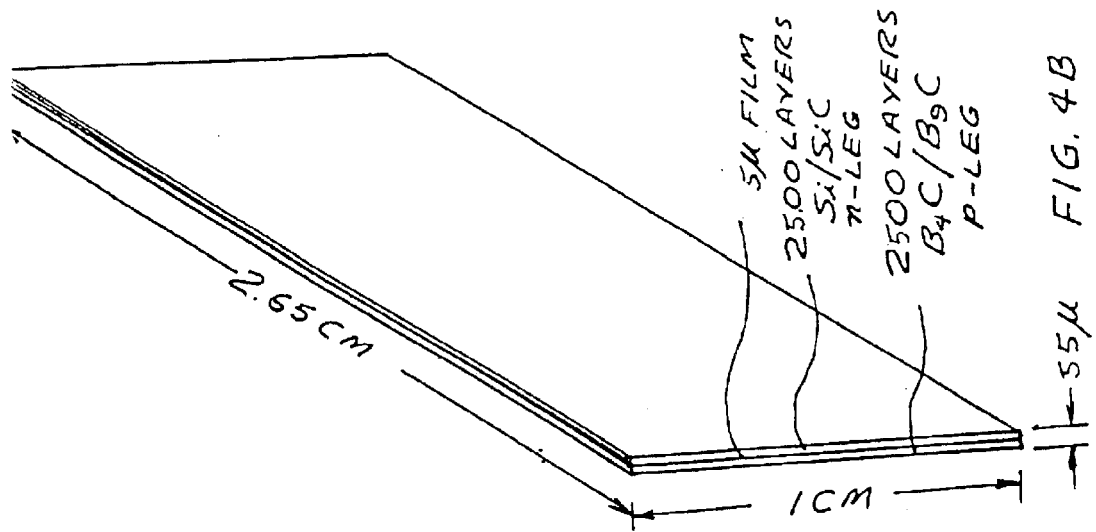
FIGS. 4A and 4B are views of a preferred thermoelectric couple.
Figure 4A:
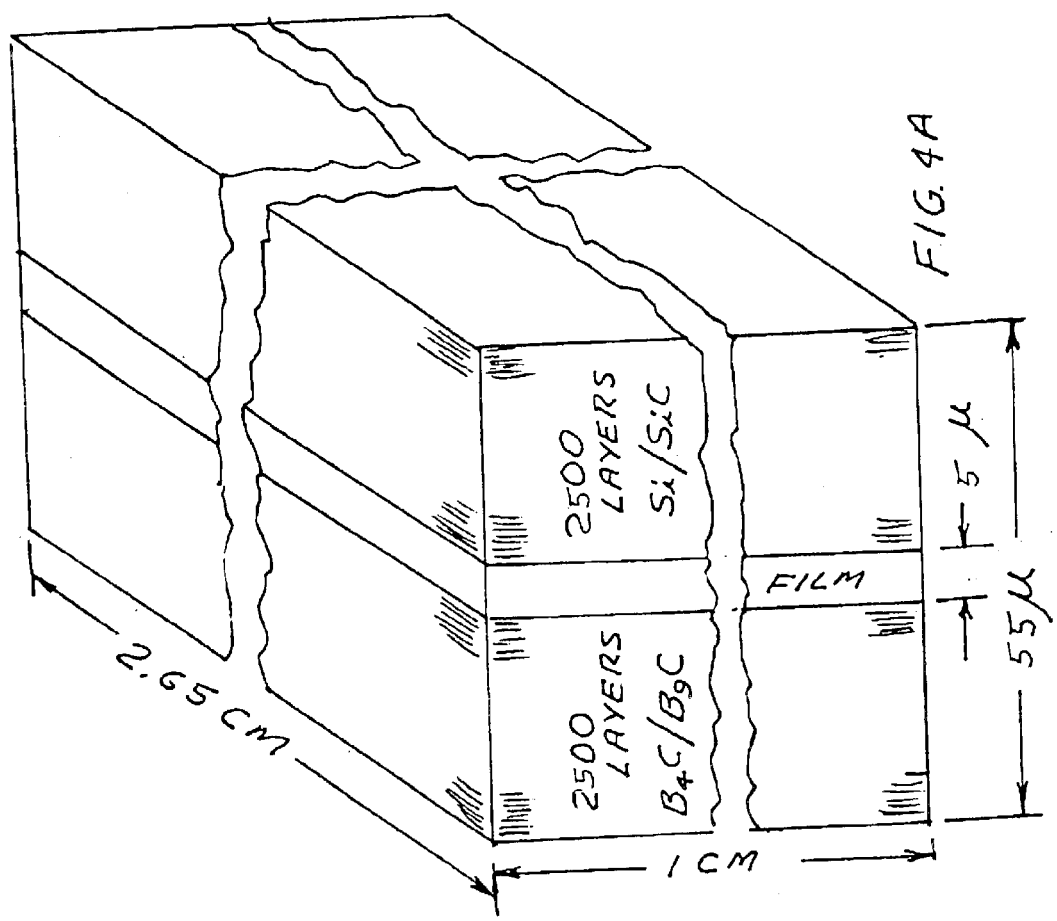

Preferred techniques for preparation of thermoelectric film can be explained by reference to FIGS. 2A through 4I. FIG. 2A is a top view of a preferred deposition chamber for fabricating thermoelectric film. FIG. 2B is a side view sketch. A roll 40 of plain Kapton® film coated on both sides with a 0.1 micron thick layer of crystalline Si feeds take-up roll 42. The coated film is about 2.5 microns thick. Alternate layers (10 nm thick) of $B_4C$ (as the "conducting" layers) and $B_9C$ (as the "insulating" layers) are deposited on one side of the tape from sources 44 and 46 and alternate layers of SiC (for the "conducting" layers) and Si (as the "insulating" layers) are deposited on the other side from sources 48 and 50. Stepper table 52 steps the tape back and forth so that 2500 layers of Si/SiC and 2500 layers of $B_4C/B_9C$ are deposited to form each thermoelectric element. FIGS. 4A and 4B show the dimensions of each thermoelectric element comprising one p-leg and one n-leg. The element has 2500 alternating layers of $B_4C/B_9C$ (1250 layers of each) for the p-leg and 2500 layers of Si/SiC (1250 layers of each) for the n-leg, each leg being separated by one layer of silicon film about 5 microns thick. Each of the 5000 layers are about 10 nm thick.

Figure 4C:
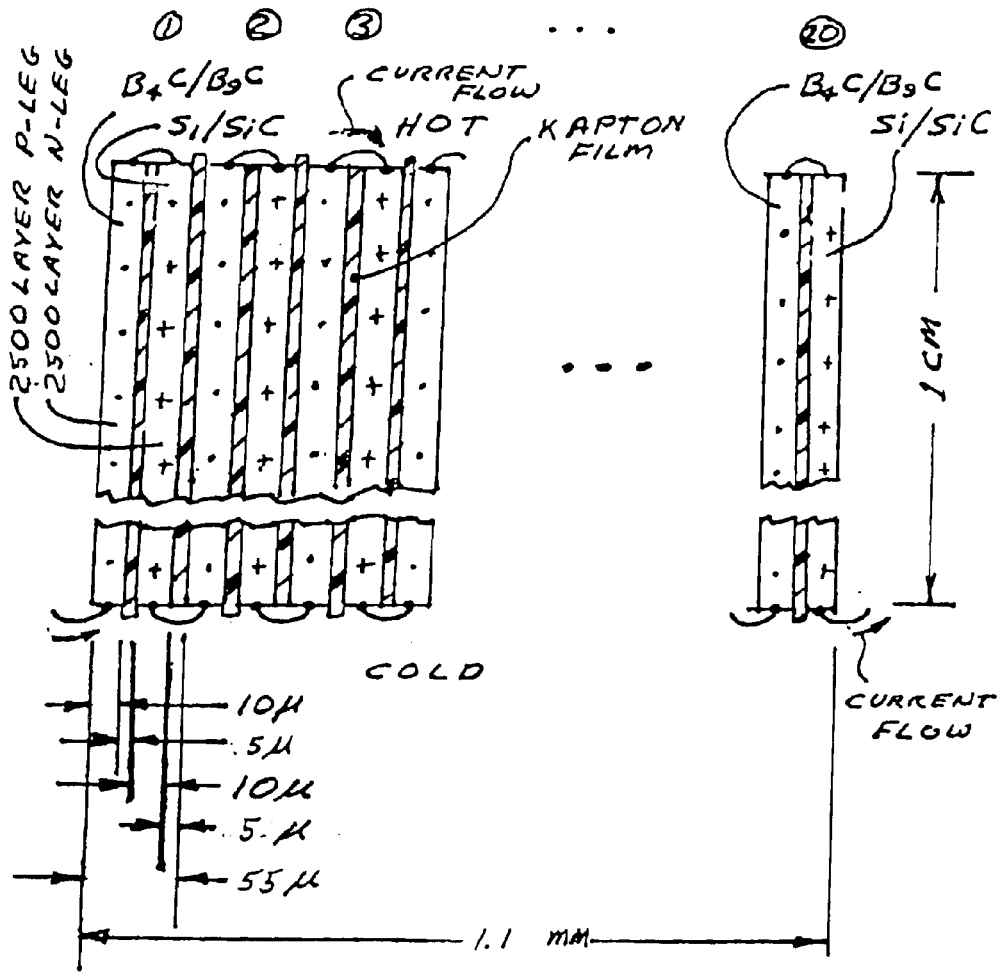
FIG. 4C shows a 20-couple thermoelectric set connected in series.

The alternating layers are 1 cm long and 2.65 cm wide so the completed element has the shape and size shown in FIG. 4B; i.e., 1 cm×2.65 cm×25 microns thick. Twenty of these elements are joined together with silicon film as shown in FIG. 4C to form a 20 couple thermoelectric set. The elements are connected in series as shown in FIG. 4C with a copper bond that may be made using a vapor deposition process. Note that the silicon insulating layers are allowed to extend beyond the thermoelectric material where the legs are not to be connected so the copper deposit can be uniformly applied then lapped until the separating insulator layers are exposed. Each of the couples (one n-leg and one p-leg) will generate about 2 mV/degree C. So with a 300 degree C. temperature difference, the 20-element set will create a potential of about 12 Volts.

Figure 4D:
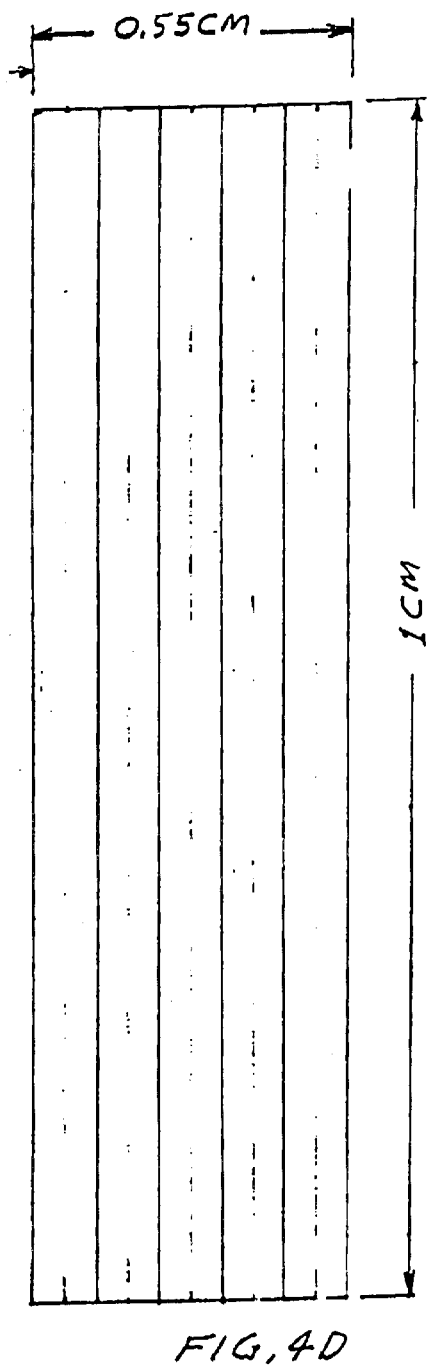
FIGS. 4D and 4E are views of a 100-couple thermoelectric set.
Figure 4E:
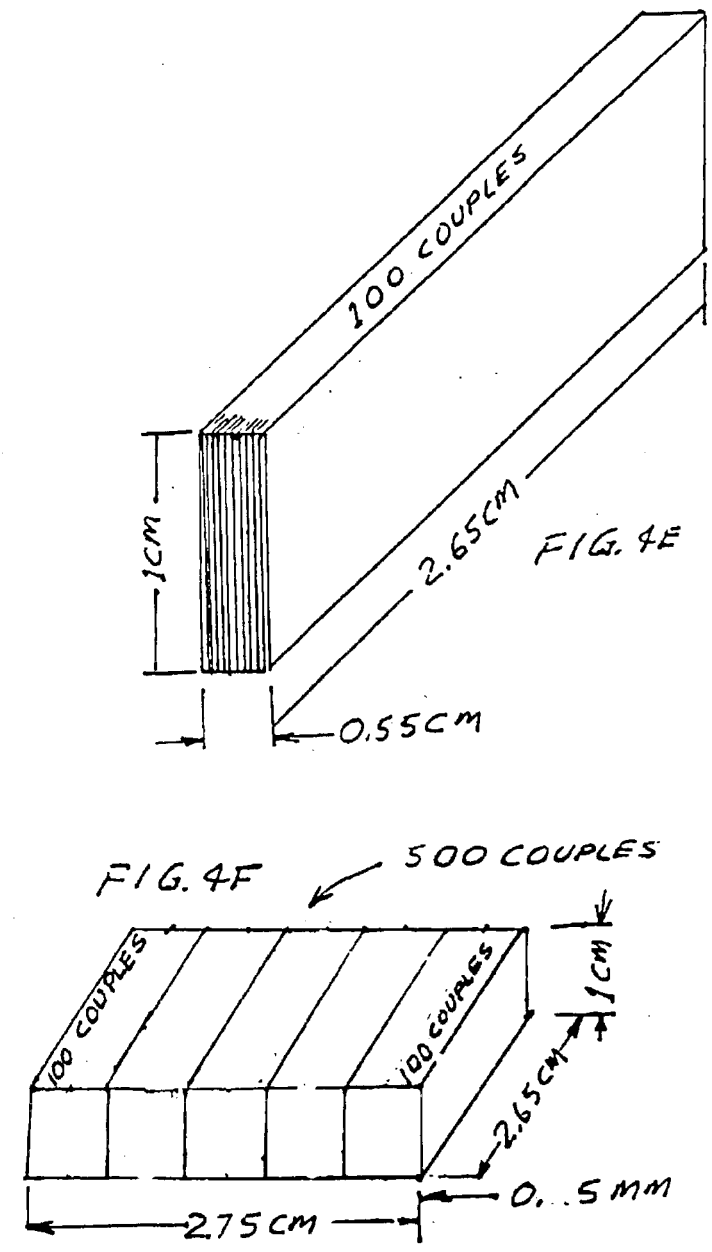

Five of these twenty couple thermoelectric sets are joined together as shown in FIG. 4D to form a 100 couple thermoelectric set but the five sets are connected in parallel so that the potential produced is still 12 Volts. This 100-element set is shown in prospective in FIG. 4E. The dimensions of this set are 1.0 cm×2.65 cm×0.25 cm.

Figure 4F:
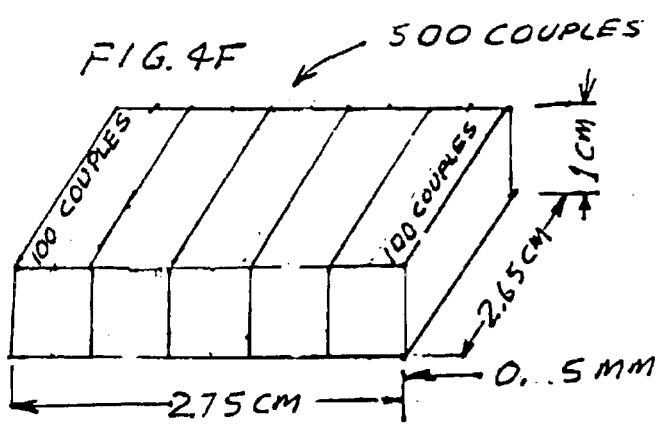
FIG. 4F is a sketch showing dimensions of a 1000 couple thermoelectric module.
Figure 4H:
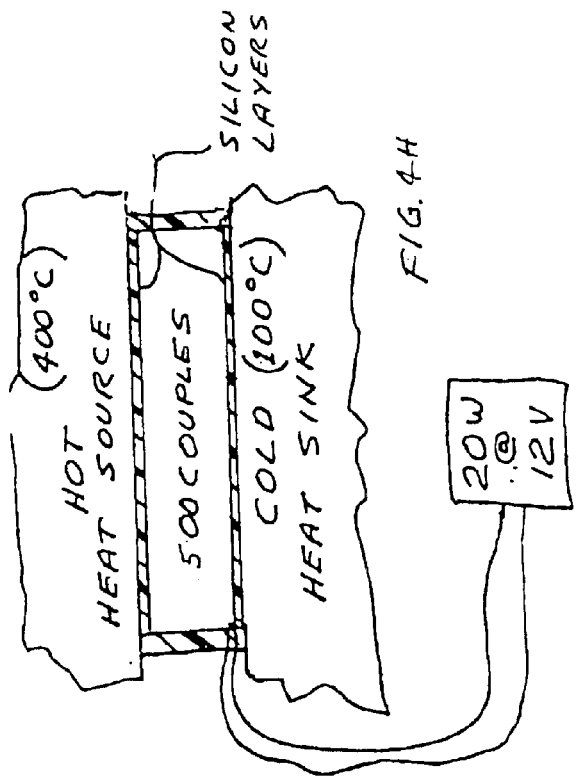
FIG. 4H shows the module in use.
Figure 4G:
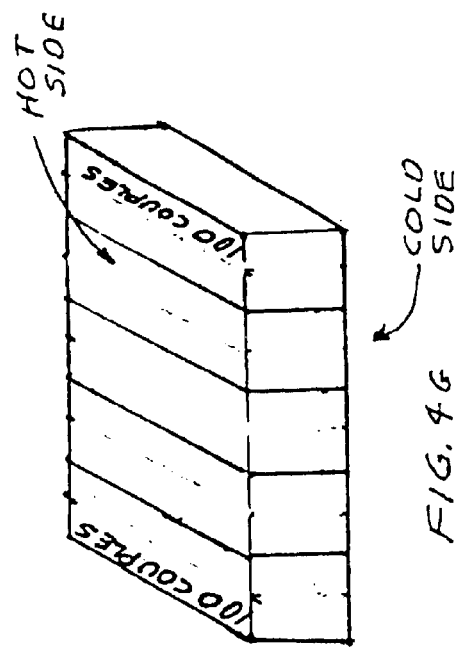
FIG. 4G is another view of the FIG. 4F module.
Figure 4I:
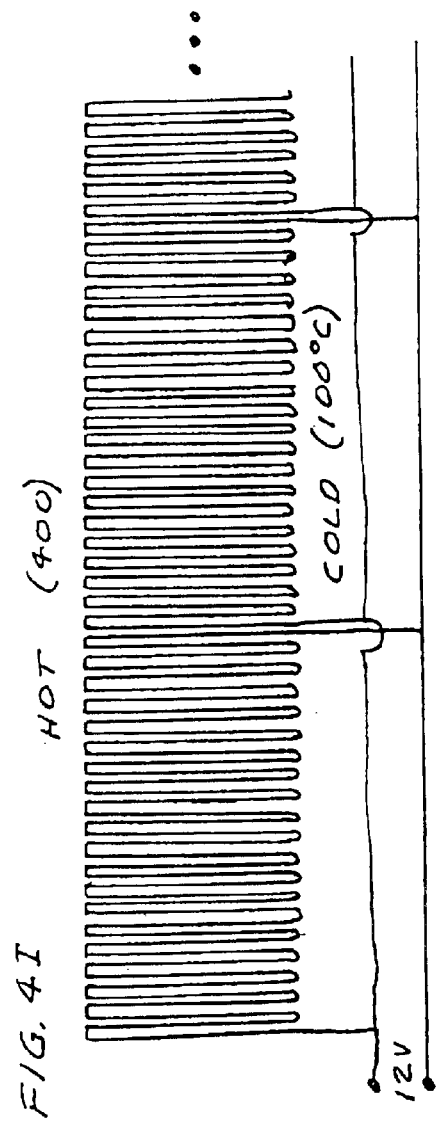
FIG. 4I shows how the legs of the module are connected electrically.

Finally five of these 100-element sets are joined to form a 500-couple thermoelectric module as shown in FIG. 4F which has the dimensions 2.65 cm×2.75 cm×1 cm. This module is mounted as shown in FIGS. 4G and 4H with each of the two 7 cm$^2$ sides positioned tightly against a hot heat source at 400 degrees C. and a cold heat sink at 100 degrees C. Again, the 100 element sets are connected in parallel so the voltage generated remains at about 12 Volts. The electrical connections are as shown in FIG. 4I.

Substrates Substrates for Superlattice Thermoelectric Material

As described in U.S. Pat. Nos. '467, '387, '964 and '965, quantum well thermoelectric material is preferably deposited in layers on substrates. For a typical substrate as described in those patents, heat loss through the substrate can greatly reduce the efficiency of a thermoelectric device made from the material. If the substrate is removed some of the thermoelectric layers could be damaged and even if not damaged the process of removal of the substrate could significantly increase the cost of fabrication of the devices. The present invention provides a substrate that can be retained. The substrate preferably should be very thin, a very good thermal and electrical insulator with good thermal stability and strong and flexible.

Silicon

Silicon is the preferred substrate material for depositing the Si/SiGe and $B_4C/B_9C$ layers. Si has also been used by Applicants as a substrate for depositing Si/SiGe alloys. Si is available commercially in films as thin as 5 microns from suppliers such as Virginia Simiconductor with offices in Fredricksburg, Va. By using a 5 micron substrate the amount of bypass heat loss can be held to a minimum. For commercial applications the quantum well film will be approximately 25 microns thick as explained above. Thus the ratio of quantum well thickness to substrate thickness is more than sufficient to greatly minimize by-pass heat losses. Si is also preferred because its 110 atomic orientation is well suited for the thermoelectric materials. The silicon film is stable at much higher temperatures than Kapton.

Kapton®

Kapton is a product of DuPont Corporation. According to DuPont bulletins:

Kapton® polyimide film possesses a unique combination of properties that make it ideal for a variety of applications in many different industries. The ability of Kapton® to maintained its excellent physical, electrical, and mechanical properties over a wide temperature range has opened new design and application areas to plastic films.

Kapton® is synthesized by polymerizing an aromatic dianhydride and an aromatic diamine. It has excellent chemical resistance; there are no known organic solvents for the film. Kapton® does not melt or burn as it has the highest UL-94 flammability rating: V-0. The outstanding properties of Kapton® permit it to be used at both high and low temperature extremes where other organic polymeric materials would not be functional.

Adhesives are available for bonding Kapton® to itself and to metals, various paper types, and other films.

Kapton® polyimide film can be used in a variety of electrical and electronic insulation applications: wire and cable tapes, formed coil insulation, substrates for flexible printed circuits, motor slot liners, magnet wired insulation, transformer and capacitor insulation, magnetic and pressure-sensitive tapes, and tubing. Many of these applications are based on the excellent balance of electrical, thermal, mechanical, physical, and chemical properties of Kapton® over a wide range of temperatures. It is this combination of useful properties at temperature extremes that makes Kapton® a unique industrial material.

Kapton® Substrate

Applicants have demonstrated that Kapton can be useful as a substrate film for superlattice thermoelectric layers when high temperature use is not planned. Applicants have shown that a crystal layer laid down between the Kapton® substrate and the series of very thin conducting and barrier layers greatly improve thermoelectric performance especially for n-type layers. The preferred technique is to lay it on about 1000 Å thick in an amorphous form then to crystallize it by heating the substrate and the silicon layer to about 350° C. to 375° C. The crystalline layer should have the same crystalline structure as the layers.

Other Substrates

Many other organic materials such as Mylar, polyethylene, and polyamide, polyamide-imides and polyimide compounds could be used as substrates. Other potential substrate materials are oxide films such as $SiO_2$, $Al_2O_3$ and $TiO_2$. Mica could also be used for substrate. As stated above, the substrate preferably should be very thin a very good thermal and electrical insulator with good thermal stability, strong and flexible.

Other Lattice Materials

Many other thermoelectric materials may be used as p-legs along with Si/SiC n-legs. Superlattice materials are preferred. Measurements of thermal conductivity normally show a threefold reduction in QW films compared with bulk materials, as reported below. Applicants have found that Si/SiGe multi-layer films performed well at room temperature and below, but their performance at temperatures in the range of 250 degrees C. fell to that of bulk bismuth telluride.

While the above description contains many specificities, the reader should not construe these as limitations on the scope of the invention, but merely as exemplifications of preferred embodiments thereof. Those skilled in the art will envision many other possible variations within its scope. The thin layers of boron carbide and Si/SiC could be arranged in many other forms for various applications. It is not necessary that the layers be grown on film. For example, they could be grown on thicker substrates that are later removed. There are many other ways to make the connections between the legs other than the methods discussed. Accordingly, the reader is requested to determine the scope of the invention by the appended claims and their legal equivalents, and not by the examples which have been given.

We claim:

1. A thermoelectric module comprised of:
   A) a plurality of n-legs comprised of at least 100 very thin alternating layers of silicon and silicon carbide said alternating layers defining n-leg interfaces where said alternating layers face each other; and
   B) a plurality of p-legs,; said p-legs and said n-legs being electrically connected to produce said thermoelectric module, with directions of heat flow and electric current flow in said n-legs being parallel to said n-leg interfaces.

2. A thermoelectric module as in claim 1 wherein said p-legs comprise at least 100 very thin alternating layers of boron carbide, said alternating boron carbide layers defining p-leg interfaces where said alternating layers of boron carbide face each other, wherein heat flow and electric current flow in said p-legs is parallel to said p-leg interfaces.

3. A thermoelectric module as in claim 2 wherein said very thin alternating layers of boron carbide comprise two different stoichiometric forms of boron carbide.

4. A thermoelectric module as in claim 3 wherein said very thin alternating layers of boron carbide are alternating layers of $B_4C$ and $B_9C$.

5. A thermoelectric module as in claim 2, wherein said plurality of n-legs is comprised of a plurality of very thin alternating layers of silicon and silicon-carbide and said very thin alternating layers of boron carbide are alternating layers of $B_4C$ and $B_9C$.

6. A thermoelectric module as in claim 1 wherein said alternating layers are deposited on a substrate.

7. A thermoelectric module as in claim 6 wherein said substrate is silicon.

8. A thermoelectric module as in claim 6 wherein said substrate is silicon film.

9. A thermoelectric module as in claim 6 wherein said substrate is a polyimide substrate.

10. A thermoelectric element as in claim 1, wherein said very thin alternating layers are each less than 100 nm thick.

11. A thermoelectric element as in claim 1 wherein said very thin alternating layers are each about 10 nm thick.

12. A thermoelectric element as in claim 9 wherein said plurality of very thin alternating layers is at least 1250 layers.

* * * * *